United States Patent
Suzuki et al.

(10) Patent No.: US 9,437,319 B1
(45) Date of Patent: Sep. 6, 2016

(54) METHOD FOR PROGRAMMING NON-VOLATILE MEMORY WITH REDUCED BIT LINE INTERFERENCE AND ASSOCIATED DEVICE

(71) Applicant: Macronix International Co., Ltd., Hsin-Chu (TW)

(72) Inventors: Atsuhiro Suzuki, Hsinchu (TW); Ya Jui Lee, Taichung (TW); Kuan Fu Chen, Taipei (TW); Chih-Wei Lee, New Taipei (TW)

(73) Assignee: MACRONIX INTERNATIONAL CO., LTD., Hsin-Chu (TW)

( * ) Notice: Subject to any disclaimer, the term of this patent is extended or adjusted under 35 U.S.C. 154(b) by 0 days.

(21) Appl. No.: 14/750,065

(22) Filed: Jun. 25, 2015

(51) Int. Cl.
  *G11C 11/34* (2006.01)
  *G11C 16/34* (2006.01)
  *G11C 16/10* (2006.01)
  *G11C 11/56* (2006.01)

(52) U.S. Cl.
  CPC ....... *G11C 16/3427* (2013.01); *G11C 11/5628* (2013.01); *G11C 16/10* (2013.01)

(58) Field of Classification Search
  USPC ............ 365/185.03, 185.18, 185.21, 185.22, 365/185.24, 185.26, 185.33
  See application file for complete search history.

(56) References Cited

U.S. PATENT DOCUMENTS

| | | | | |
|---|---|---|---|---|
| 7,764,542 B2* | 7/2010 | Edahiro | ............ | G11C 16/3418 |
| | | | | 365/185.03 |
| 8,305,813 B2* | 11/2012 | Lee | ........................ | G11C 16/24 |
| | | | | 365/185.22 |
| 8,351,270 B2* | 1/2013 | Ahn | ..................... | G11C 11/5628 |
| | | | | 365/185.18 |
| 9,165,662 B2* | 10/2015 | Kim | ....................... | G11C 16/12 |

* cited by examiner

*Primary Examiner* — Trong Phan
(74) *Attorney, Agent, or Firm* — Alston & Bird LLP (57) ABSTRACT

Provided are methods, devices, and/or the like for reducing the bit line interference when programming non-volatile memory. One method comprises providing a non-volatile memory device comprising a set of cells, each cell associated with a bit line; shooting a programming voltage across each cell; detecting a threshold voltage for each cell; identifying a fast subset of the set of cells and a slow subset of the set of cells based at least in part on the detected threshold voltage for each cell; and shooting the programming voltage until the threshold voltage for each cell is greater than a verify voltage. For each shot a fast bit line bias is applied to the bit line associated each cell of the fast subset and a slow bit line bias is applied to the bit line associated with each cell of the slow subset.

20 Claims, 5 Drawing Sheets

METHOD FOR PROGRAMMING NON-VOLATILE MEMORY WITH REDUCED BIT LINE INTERFERENCE AND ASSOCIATED DEVICE

BACKGROUND

Non-volatile memory devices, such as flash memory devices, store data in cells. The cells generally comprise semiconductor material configured to allow the cell to be placed in a particular state and allow that state to be read at a later time. For example, a cell having two states (e.g., 0 and 1) may be placed in a particular state by iteratively applying a programming voltage across the cell. At a later point in time, a reading voltage may be applied to the cell and the resulting current across the cell may be determined to determine the state of the cell. The reading voltage may be greater than the threshold voltage for one state and less than the threshold voltage for the other state. If the current resulting from the applied reading voltage is low or approximately zero, it is determined that the cell is in one state and if the current is not low, than it is determined that the cell is in the other state. Multi-level cells (e.g., cells having more than two states) are also known and commonly used.

When a number of cells are combined to form a memory device or a memory chip, coupling between cells can occur. For example, cell-to-cell interference, such as bit line interference has been attributed to a parasitic capacitance coupling effect in which the threshold voltage of one cell is changed by a shifting the threshold voltage of a neighboring cell. This may cause the victim or attacked cell to be over programmed or placed in the wrong state.

Various attempts to reduce bit line interference have been made. These attempts focus on topology tuning such as including an air-gap or a deeper control gate plug between field gates. However, too deep a control gate plug or a non-uniform air-gap will degrade cell reliability and performance.

Therefore, there is a need in the art for methods, devices, and/or the like for reducing bit line interference. In particular, there is a need in the art for methods, devices, and/or the like for reducing bit line interference without degrading cell reliability and performance.

BRIEF SUMMARY

Embodiments of the present invention provide methods, devices, and/or the like for reducing the bit line interference when programming non-volatile memory, such as flash memory. In particular, embodiments of the present invention utilize an incremental step pulse programming (ISPP) operation scheme that reduces the range of threshold voltages for set of cells being programmed.

In one aspect of the present invention, a method for reducing bit line interference when programming a non-volatile memory device is provided. In one embodiment, the method comprises providing a non-volatile memory device comprising a set of cells, each cell associated with a bit line. The method may further comprise shooting a programming voltage across each cell of the set of cells; detecting a threshold voltage for each cell; identifying a fast subset of the set of cells and a slow subset of the set of cells based at least in part on the detected threshold voltage for each cell; and shooting the programming voltage until the threshold voltage for each cell of the set of cells is greater than a verify voltage. For each shot a fast bit line bias is applied to the bit line associated each cell of the fast subset and a slow bit line bias is applied to the bit line associated with each cell of the slow subset.

In another aspect of the present invention, a non-volatile memory device with reduced bit line interference is provided. In one embodiment, the device comprises a plurality of memory cells; and a chip controller. The chip controller is configured to program a set of cells of the plurality of memory cells by shooting a programming voltage across each cell of the set of cells; detecting a threshold voltage for each cell; identifying a fast subset of the set of cells and a slow subset of the set of cells based at least in part on the detected threshold voltage for each cell; and shooting the programming voltage until the threshold voltage for each cell of the set of cells is greater than a verify voltage. For each shot a fast bit line bias is applied to the bit line associated with each cell of the fast subset and a slow bit line bias is applied to the bit line associated with each cell of the slow subset.

In yet another aspect of the present invention, a method for reducing bit line interference when programming a non-volatile memory comprising multi-level cells is provided. In one embodiment, the method comprises providing a non-volatile memory device comprising a set of multi-level cells. Each cell is associated with a bit line and each cell is associated with a data state to which the cell is to be programmed. The method further comprises determining that the cells are to be programmed from the OIL state; identifying any cells having a threshold voltage greater than a verify voltage corresponding to the data state associated with the cell and creating a set of uninhibited cells by inhibiting the programming of the identified cells; shooting a programming voltage across each cell of the set of uninhibited cells; detecting a threshold voltage for each cell of the set of uninhibited cells; identifying a fast subset of the set of uninhibited cells and a slow subset of the set of uninhibited cells based at least in part on the detected threshold voltage for each cell; and shooting the programming voltage until the threshold voltage for each cell of the set of uninhibited cells is greater than a verify voltage corresponding to the data state associated with the cell. For each shot a fast bit line bias is applied to each bit line associated with a cell of the fast subset and a slow bit line bias is applied to each bit line associated with a cell of the slow subset.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1A:
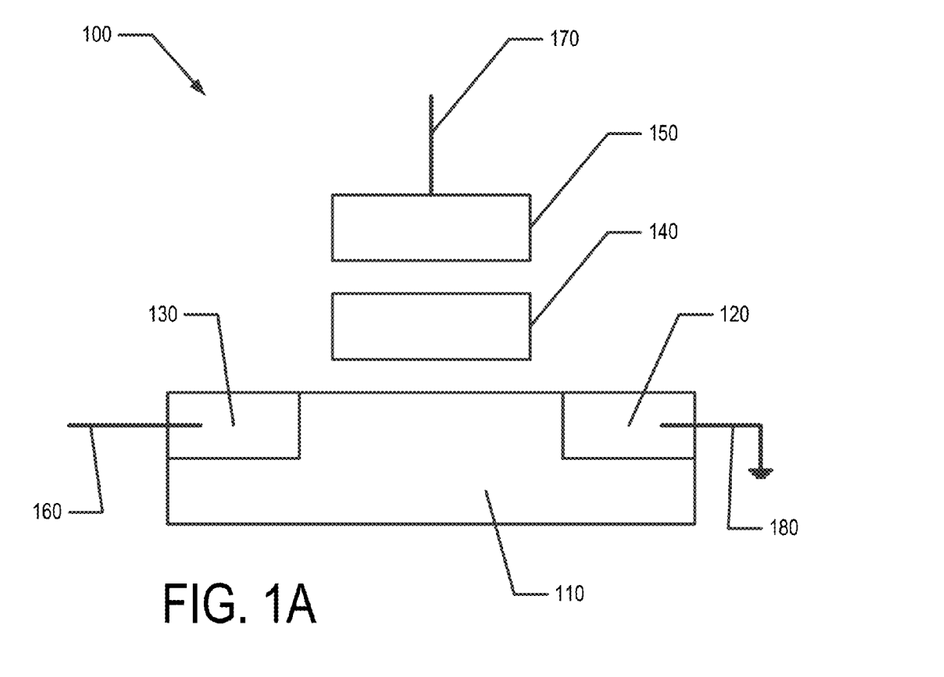
FIG. 1A provides a schematic diagram of a memory cell in accordance with an embodiment of the present invention.

FIG. 1A illustrates a memory cell 100 that may be used in accordance with various embodiments of the invention. In some embodiments, the memory cell 100 is a single-level cell (e.g., the cell may be placed in either state 0 or state 1). In other embodiments, the memory cell 100 is a multi-state cell (e.g., the cell may be placed in any of states 00, 01, 10, or 11; or the cell may be placed in any of states 000, 001, 010, 011, 100, 101, 110, or 111; and/or the like). The memory cell 100 may comprise a substrate 110, a source 120 electrically connected to ground 180, and a drain 130 electrically connected to a bit line 160. The memory cell 100 may further comprise a field gate 140 and a control gate 150. The control gate 150 may be electrically connected to a word line 170. In various embodiments oxide or dielectric layers may separate the field gate 140 from one or both of the substrate 110 and the control gate 150. As should be understood, aspects of the present invention may be employed with a variety of non-volatile memory cells.

Figure 1B:
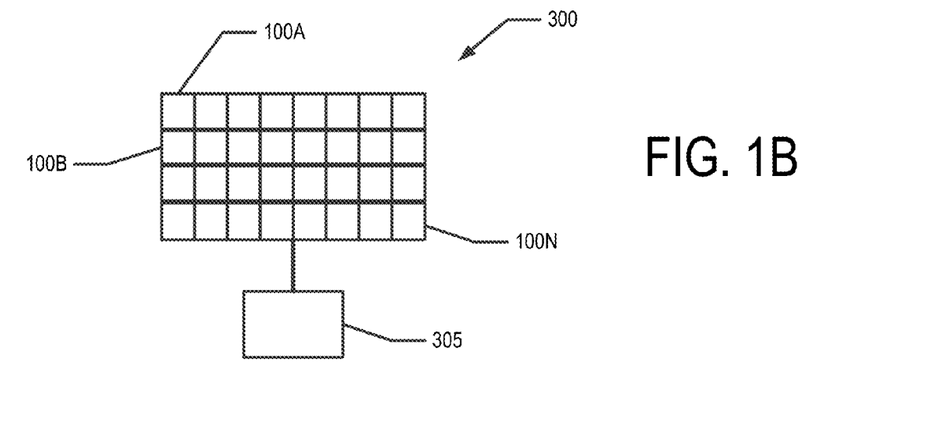
FIG. 1B provides a schematic diagram of a non-volatile memory device in accordance with an embodiment of the present invention.

A series of memory cells 100 may be grouped into a page and multiple pages may be combined to provide memory storage or a memory device. One or more pages may be on a chip having and/or in communication with a chip controller 305 to provide memory storage or a memory device. For example, as shown in FIG. 1B, a memory device 300 may comprise a plurality of memory cells 100A, 100B, . . . , 100N in communication with a chip controller 305. In various embodiments, the chip controller 305 may be a memory controller, flash memory controller, and/or the like. In various embodiments, the memory device 300 may comprise other components for storing, programming, processing, and/or the like.

Figure 3A:
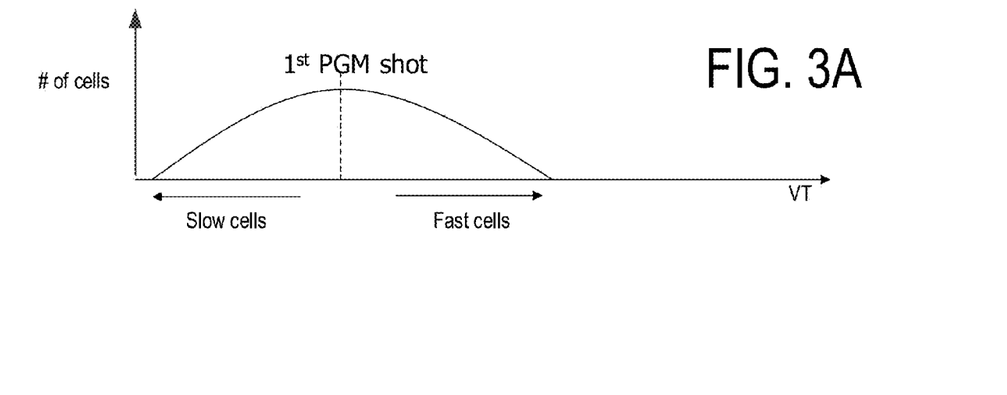
FIGS. 3A and 3B illustrate the threshold voltage distribution of a set of memory cells at various steps in the flowchart shown in FIG. 2.
Figure 3B:
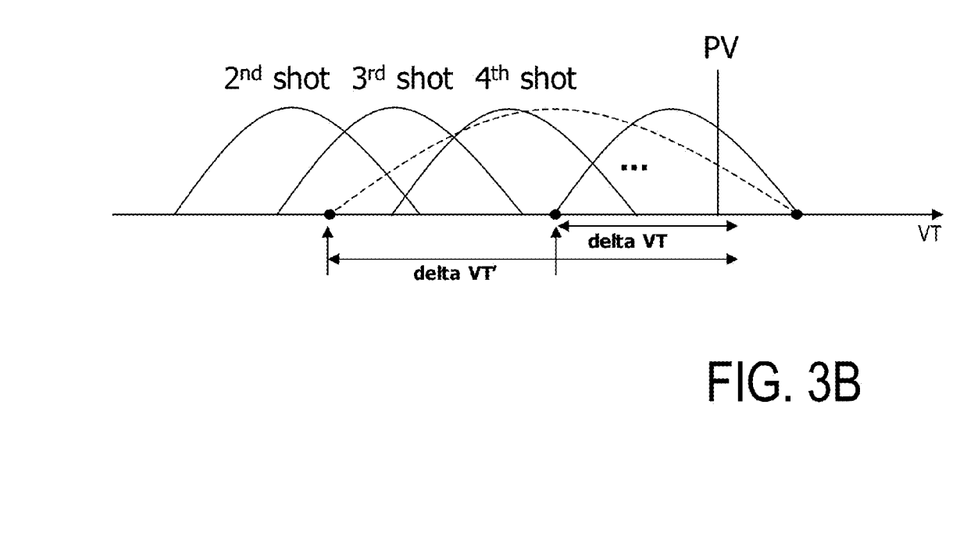

As noted above, bit line interference reduces the reliability of a non-volatile (e.g., flash) memory device. The bit line interference voltage, $V_{BLI} = \Delta V_T * \sigma_{BL}$, where $\sigma_{BL}$ is the bit line coupling ratio and $\Delta V_T$ is the difference in voltage between the program verify voltage PV and the threshold voltage $V_T$ of the cell having the lowest threshold voltage $V_{T,min}$ when the cell having the largest threshold voltage $V_{T,max}$ has a threshold voltage equal to or larger than PV. For example, as shown in FIG. 3B, $\Delta V_T = PV - V_{T,min}$ when $V_{T,max} \geq PV$. The present invention reduces the bit line interference voltage $V_{BLI}$ by reducing $\Delta V_T$ by using an operating scheme without affecting or without significantly affecting the cell or memory device performance.

Figure 2:
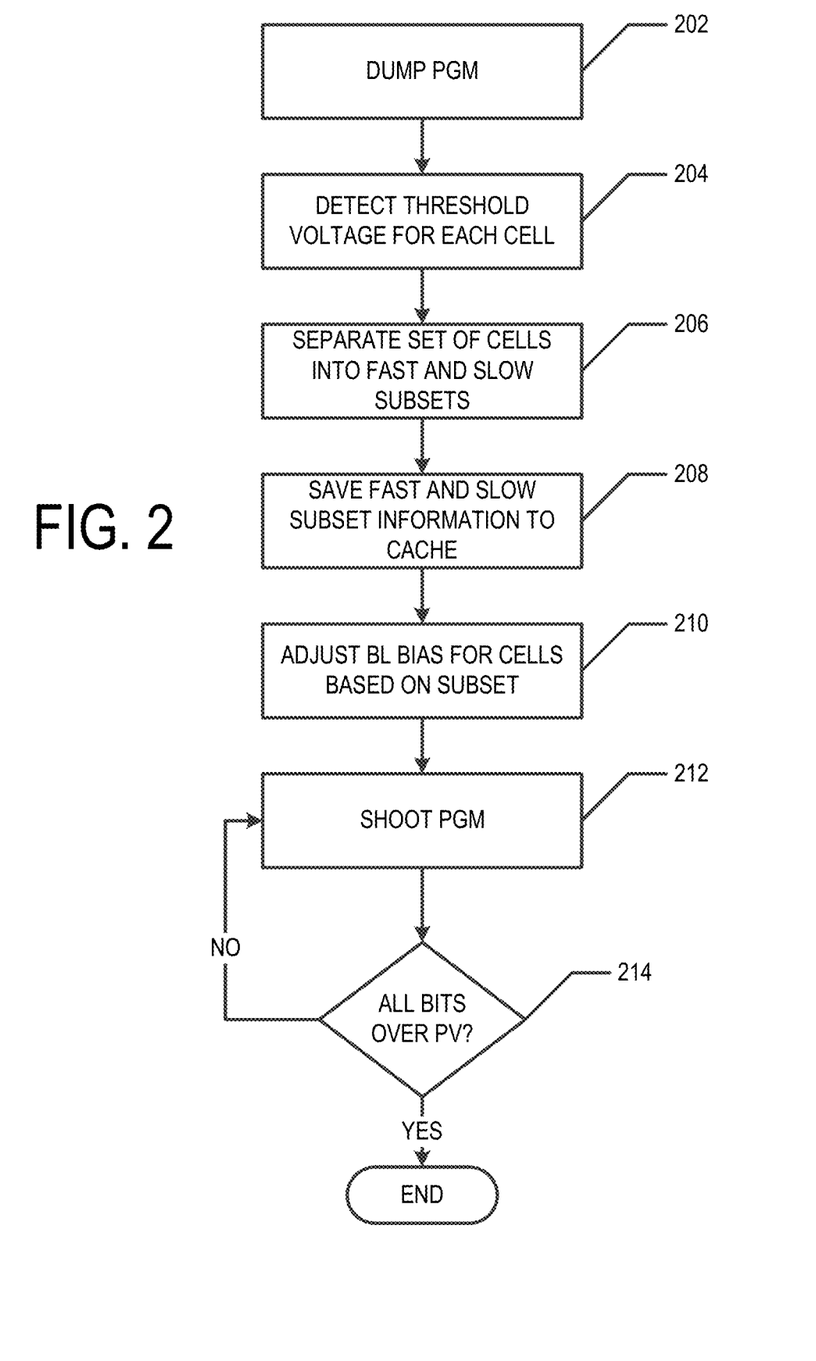
FIG. 2 provides a flowchart of processes and procedures that may be completed in accordance with an embodiment of the present invention.

FIG. 2 illustrates a flowchart of various processes and procedures that may be completed to program a set of memory cells with reduced bit line interference, in accordance with various embodiments of the present invention. FIGS. 3A and 3B schematically illustrate some of the processes and procedures shown in FIG. 2.

Starting at step 202, the programming voltage PGM is dumped. For example, the programming voltage PGM may be applied to the set of memory cells to be programmed for a predetermined period of time (e.g., 150 ns and/or the like). For example, a chip controller 305 may dump PGM for a set of memory cells to be programmed. At step 204, the threshold voltage $V_T$ for each cell in the set of memory cells is detected. For example, the chip controller 305 may detect a threshold voltage $V_T$ for each cell in the set of memory cells. FIG. 3A shows the distribution of threshold voltage $V_T$ for the set of memory cells to be programmed as a result of the first shot of PGM (1st PGM shot) (e.g., the PGM dump of step 202). The detected threshold voltage $V_T$ for the cells in the set of memory cells includes slower cells having a lower detected threshold voltage $V_T$ and faster cells having a higher detected threshold voltage $V_T$.

Returning to FIG. 2, at step 206, the set of cells to be programmed is divided into two or more subsets based on the detected threshold voltages $V_T$. For example, the chip controller 305 may divide the set of cells into two or more subsets based on the detected threshold voltages $V_T$. In various embodiments, a cutoff voltage $V_c$ may be defined such that cells having a threshold voltage equal to or greater than the cutoff voltage ($V_T \geq V_c$) are in one subset and cells having a threshold voltage less than the cutoff voltage ($V_T < V_c$) are in another subset. For example, in various embodiments, the chip controller 305 may define the cutoff voltage $V_c$. In various embodiments, the cutoff voltage $V_c$ may be selected based in part on the detected threshold voltages and/or such that approximately half of the cells are in each of the fast and slow subset. In one embodiment, the cutoff voltage $V_c$ is predetermined. In various embodiments, the threshold voltage of a cell may correspond to the speed of the cell. For example, cells having a larger threshold voltage have a larger speed and/or be faster. Thus, the subset of cells having $V_T \geq V_c$ may be termed the fast subset and the subset of cells having $V_T < V_c$ may be termed the slow subset.

In various embodiments, the memory cells may be divided into more than two subsets. For example, the chip controller 305 may divide the set of memory cells into three or more subsets. For example, the chip controller 305 may divide the set of memory cells into three or more subsets by defining two or more cutoff voltages. For example, the memory cells may be divided into three subsets. For example, the memory cells may be divided into a slow subset of cells having $V_T \leq V_{c1}$, a middle subset of cells having $V_{c1} < V_T < V_{c2}$, and a fast subset of cells having $V_T > V_{c2}$, where $V_{c1}$ is a first cutoff voltage, $V_{c2}$ is a second cutoff voltage, and $V_{c1} < V_{c2}$. In practice the number of subsets is limited to five or less due to circuit constraints of the memory device and/or program performance requirements.

At step 208, information identifying the memory cells of the fast subset and/or the cells of the slow subset is saved to cache. For example, a list of cells associated with the fast subset may be saved to cache and/or a list of cells associated with the slow subset may be saved to cache. For example, the chip controller 305 may cause information identifying the memory cells of the fast subset and/or the memory cells of the slow subset in cache. At step 210, the bit line bias for each cell of the set of cells is adjusted based on the detected threshold voltage of the cell and/or the assigned subset of the cell (e.g., whether the cell is associated with the fast, slow, or a middle subset). In various embodiments, the bit line bias applied to each bit line may be based on the information saved to cache at step 208. For example, for all of the cells associated with the fast subset, a fast bit line bias $V_{BL,F}$ may be applied to the corresponding bit line. For example, for all of the cells associated with the slow subset, a slow bit line bias $V_{BL,S}$ may be applied to the corresponding bit line. If there are cells associated with a middle subset, then for all of the cells associated with the middle subset, a middle bit line bias $V_{BL,M}$ may be applied to the corresponding bit line. For example, the chip controller 305 may cause a fast bit line bias $V_{BL,F}$ to be applied to each bit line associated with a cell of the fast subset and a slow bit line bias $V_{BL,S}$ to be applied to each bit line associated with a cell of the slow subset. In various embodiments, the fast bit line bias is greater than the slow bit line bias ($V_{BL,F} > V_{BL,S}$). The middle bit line bias may be greater than slow bit line bias and less than the fast bit line bias ($V_{BL,F} > V_{BL,M} > V_{BL,S}$). In one embodiment, the fast bit line bias $V_{BL,F}=0.5$ V and the slow bit line bias $V_{BL,S}=0.0$ V.

At step 212, the programming voltage is shot for each cell of the set of cells. For example, a second, third, fourth, etc. programming voltage PGM (e.g., $2^{nd}$ shot, $3^{rd}$ shot, $4^{th}$ shot) may be shot across each cell of the set of cells, as shown in FIG. 3B. For example, the chip controller 305 may shoot the programming voltage PGM across each cell of the set of cells while causing the appropriate bit line bias to be applied to the bit line associated with each cell of the set of cells. For example, the programming voltage, PGM may be applied to each cell for a predetermined period of time (e.g., 150 ns and/or the like as appropriate for the memory cell). The solid line distributions of FIG. 3B show example distributions of threshold voltage $V_T$ in response to each of the $2^{nd}$ shot, $3^{rd}$ shot, $4^{th}$ shot, etc. using the present invention. In the final solid line distribution shown, the fastest bits have a detected threshold voltage $V_T$ greater than the verify voltage PV. The difference in threshold voltage between the slowest cells and the verify voltage PV is delta $V_T$. The dashed distribution shows a conventional/traditional distribution (e.g., when the present invention is not used) of detected threshold voltages $V_T$ when the fastest cells have a detected threshold voltage $V_T$ greater than the verify voltage PV. Delta $V_T'$ shows the difference in threshold voltage between the slowest cells and the verify voltage PV for the conventional/traditional distribution. As clearly shown in FIG. 3B, delta $V_T' >$ delta $V_T$.

At step 214, it is determined if each cell of the set of cells has a threshold voltage greater than a verify voltage PV. For example, the chip controller 305 may determine if each cell of the set of cells has a threshold voltage greater than the verify voltage PV. In various embodiments, the verify voltage PV is associated with a particular data state, such that if a cell has a threshold voltage greater than the verify voltage and/or within a range at least partially defined by the verify voltage, then the cell is in the particular data state (e.g., 0, 1, 00, 01, 11, 10, etc.). If all of the cells of the set of cells have a threshold voltage equal to or greater than the verify voltage (e.g., $V_T \geq PV$ for all of the cells of the set of cells), then the programming is complete, and the process ends. If not all of the cells of the set of cells have a threshold voltage greater than the verify voltage (e.g., $V_T < PV$ for at least one of the cells of the set of cells), then the process returns to step 212, and the programming voltage is shot again. In some embodiments, the programming voltage is shot for all of the cells of the set of cells. In other embodiments, the programming voltage is only shot for cells with $V_T < PV$.

Figure 4:
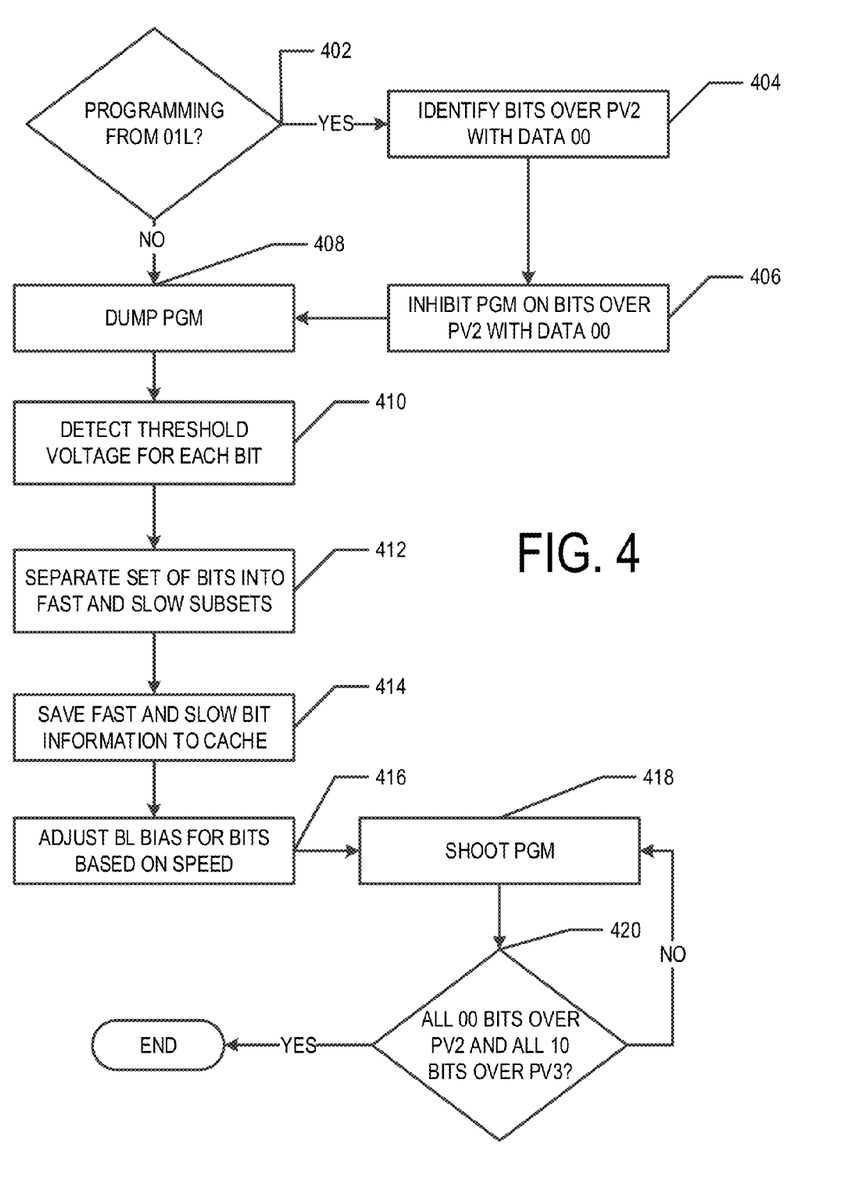
FIG. 4 provides a flowchart of processes and procedures that may be completed in accordance with an embodiment of the present invention.
Figure 5:
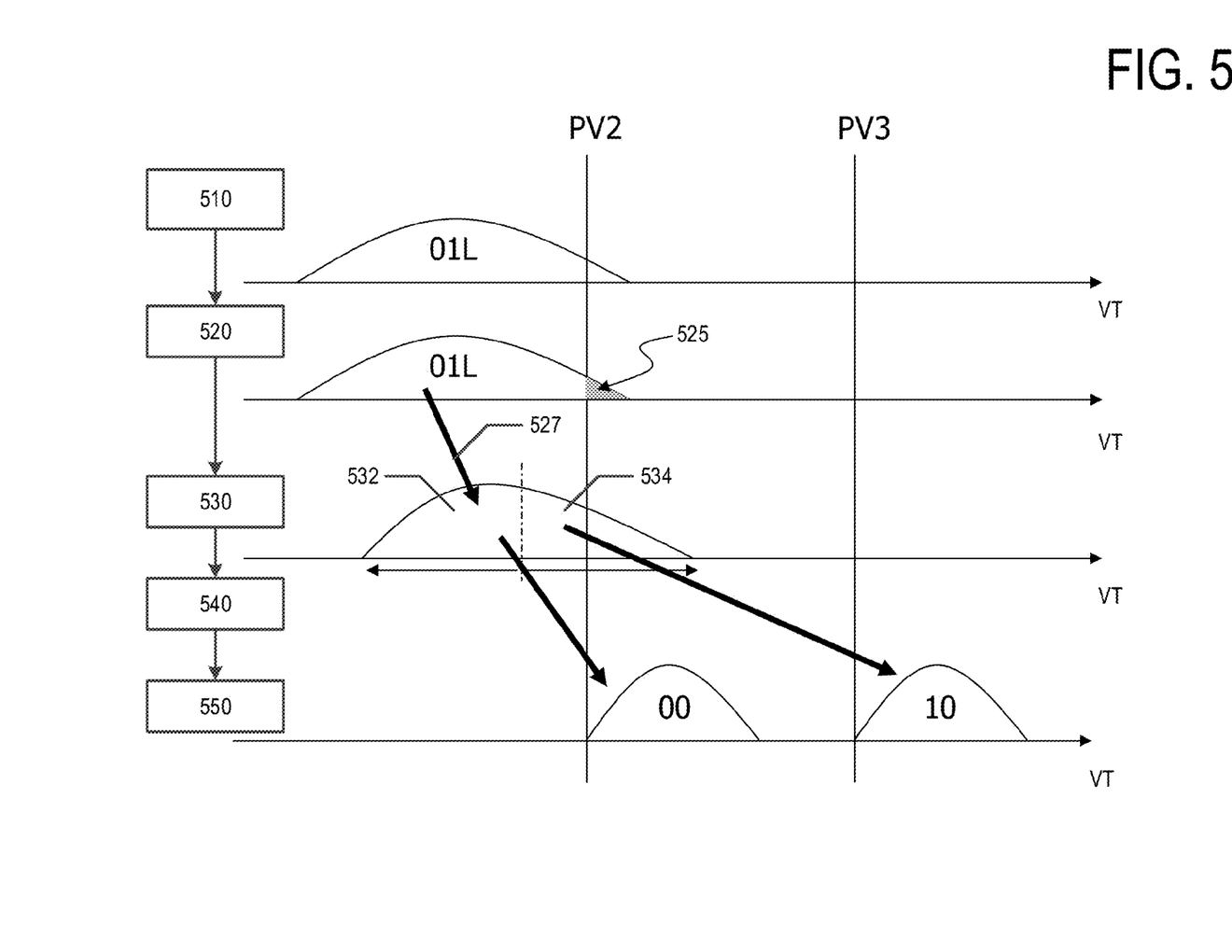
FIG. 5 illustrates the threshold voltage distribution of a set of memory cells at various steps in the flowchart shown in FIG. 4.

In various embodiments, the memory cells may be multi-level cells. For example, a multi-level memory cell may have 4 or 8 possible data states. FIGS. 4 and 5 provide a flowchart and a schematic of an embodiment of the present invention for use with multi-level memory cells. During the programming of a multi-level cell, the cell may be temporarily programmed into the 01L state. For example, the lower page programming may place a multi-level cell in the 01L state. As shown in FIG. 5, a cell in the 01L state may have a threshold voltage $V_T$ greater than a first verify voltage PV2 corresponding to a first data state (e.g., 00). As the cells already having a threshold voltage equal to or greater the first verify voltage ($V_T \geq PV2$) are already in the data state 00, attempting to program these cells into the 00 data state may lead to programming or reading errors. The flowchart of FIG. 4 provides a method for programming multi-level memory cells while preventing over programming of the cells. For example, the method for programming multi-level memory cells while preventing over programming may include a pre-verify step as schematically shown in FIG. 5.

Referring to FIG. 4, starting at step 402, it is determined if the cells being programmed are being programmed from the 01L state. For example, the chip controller 305 may determine if the cells being programmed are being programmed from the 01L state, as shown in 510 of FIG. 5. If the cells are not being programmed from the 01L state, the process continues to step 408. If the cells are being programmed from the 01L state, the process continues to step 404.

At step 404, cells having a threshold voltage $V_T$ greater than the first verify voltage PV2 are identified. For example, the chip controller 305 may identify all the cells for which $V_T \geq PV2$. In various embodiments, the cells having $V_T \geq PV2$ may be identified by dumping the programming voltage, shooting the programming voltage, performing a verify step, based on threshold voltage information from the programming of the lower page, and/or the like. At step 406, the cells identified as having $V_T \geq PV2$ may be inhibited. For example, the cells identified as having $V_T \geq PV2$ that are to be programmed into the 00 state may be determined to already have been programmed, as illustrated by shaded region 525 of the pre-verify 520 in FIG. 5. For example, the chip controller 305 may inhibit further programming of cells having $V_T \geq PV2$ that are to be programmed into the 00 state. The cells that are not inhibited may define an uninhibited set. For example, the set of memory cells other than the cells having $V_T \geq PV2$ that are to be programmed into the 00 state may comprise an uninhibited set of cells.

At step 408, the programming voltage PGM may be dumped for the uninhibited set of cells. For example, the chip controller 305 may shoot the programming voltage PGM without completing a verify step. At step 410, the threshold voltage $V_T$ for each cell in the set of uninhibited cells is detected. For example, the chip controller 305 may detect a threshold voltage $V_T$ for each cell in the set of uninhibited cells. The 530 of FIG. 5 shows the distribution of threshold voltage $V_T$ for the set uninhibited cells as a result of the first shot of PGM 527 (e.g., the PGM dump of step 408).

Returning to FIG. 4, at step 412, the set of uninhibited cells is divided into two or more subsets based on the detected threshold voltages $V_T$. For example, the chip controller 305 may divide the set of uninhibited cells into two or more subsets based on the detected threshold voltages $V_T$. In various embodiments, a cutoff voltage $V_c$ may be defined such that cells having a threshold voltage equal to or greater than the cutoff voltage ($V_T \geq V_c$) are in one subset and cells having a threshold voltage less than the cutoff voltage ($V_T < V_c$) are in another subset. For example, in various embodiments, the chip controller 305 may define the cutoff voltage $V_c$. In various embodiments, the cutoff voltage $V_c$ may be selected based at least in part on the detected threshold voltages and/or such that approximately half of the uninhibited cells are in each subset. In one embodiment, the cutoff voltage $V_c$ is predetermined. In various embodiments, the threshold voltage of a cell may correspond to the speed of the cell. For example, cells having a larger threshold voltage have a larger speed and/or are faster. Thus, the subset of cells having $V_T \geq V_c$ may be termed the fast subset 534 and the subset of cells having $V_T < V_c$ may be termed the slow subset 532.

In various embodiments, the uninhibited cells may be divided into more than two subsets. For example, the chip controller 305 may divide the set of uninhibited cells into three or more subsets. For example, the chip controller 305 may divide the set of uninhibited cells into three or more subsets by defining two or more cutoff voltages. For example, the uninhibited cells may be divided into three subsets. For example, the uninhibited cells may be divided into a slow subset of cells having $V_T \leq V_{c1}$, a middle subset of cells having $V_{c1} < V_T < V_{c2}$, and a fast subset of cells having $V_T \geq V_{c2}$, where $V_{c1}$ is a first cutoff voltage, $V_{c2}$ is a second cutoff voltage, and $V_{c1} < Va$. In practice the number of subsets is limited to five or less due to circuit constraints of the memory device and/or program performance requirements. In various embodiments, some of the cells of the fast subset are programmed to the 00 state and other cells of the fast subset are programmed to the 10 state. In various embodiments, some of the cells of the slow subset are programmed to the 00 state and other cells of the slow subset are programmed to the 10 state.

At step 414, information identifying the cells of the fast subset and/or the cells of the slow subset is saved to cache. For example, a list of cells associated with the fast subset may be saved to cache and/or a list of cells associated with the slow subset may be saved to cache. For example, the chip controller 305 may cause information identifying the cells of the fast subset and/or the cells of the slow subset in cache. At step 416, the bit line bias for each cell of the set of uninhibited cells is adjusted based on the detected threshold voltage of the cell, the information stored in cache, the subset with which the cell is associated (e.g., the fast subset, the slow subset, or a middle subset), and/or the like. For example, for all of the cells associated with the fast subset, a fast bit line bias $V_{BL,F}$ may be applied to the corresponding bit line. For example, for all of the cells associated with the slow subset, a slow bit line bias $V_{BL,S}$ may be applied to the corresponding bit line. For any cells associated with a middle subset, a middle bit line bias $V_{BL,M}$ may be applied to the corresponding bit line. For example, the chip controller 305 may cause a fast bit line bias $V_{BL,F}$ be applied to each bit line associated with a cell of the fast subset and a slow bit line bias $V_{BL,S}$ to be applied to each bit line associated with a cell of the slow subset. In various embodiments, the bit line bias applied to each bit line may be based at least in part on the information saved to cache at step 414. In various embodiments, the fast bit line bias is greater than the slow bit line bias ($V_{BL,F} > V_{BL,S}$). The middle bit line bias may be greater than slow bit line bias and less than the fast bit line bias ($V_{BL,F} > V_{BL,M} > V_{BL,S}$). In one embodiment, the fast line bias $V_{BL,F} = 0.5$ V and the slow bit line bias $V_{BL,S} = 0.0$ V.

At step 418, the programming voltage PGM is shot for each cell of the set of cells. For example, a second, third, fourth, etc. programming voltage may be shot across each cell of the set of uninhibited cells, as schematically illustrated by 540 in FIG. 5. For example, the chip controller 305 may shoot the programming voltage PGM across each cell of the set of uninhibited cells while causing the appropriate bit line bias to be applied to the bit line associated with each cell of the set of uninhibited cells. For example, the programming voltage PGM may be applied to each cell of the set of cells for a predetermined time (e.g., 150 ns and/or the like as appropriate). At step 420, it is determined if each cell of the set of uninhibited cells has a threshold voltage greater than the verify voltage associated with the data state to which the cell is being programmed. For example, the data state 00 may be associated with a first verify voltage PV2 and the data state 10 may be associated with a second verify voltage PV3. It may be determined if all of the cells being programmed to the data state 00 have a threshold voltage $V_T \geq $ PV2 and it may be determined if all of the cells being programmed to the data state 10 have a threshold voltage $V_T \geq $ PV3. For example, the chip controller 305 may determine if each cell of the set of uninhibited cells has a threshold voltage greater than the verify voltage corresponding to the data state to which the cell is being programmed. If all of the cells of the set of cells have a threshold voltage greater than the verify voltage corresponding to the data state to which the cell is being programmed (e.g., $V_T \geq $ PV2 for all of the cells being programmed to data state 00 and $V_T \geq $ PV3 for all of the cells being programmed to data state 10), then the programming is complete, and the process ends, as schematically illustrated by 550 of FIG. 5. If not all of the cells of the set of cells have a threshold voltage greater than the verify voltage corresponding to the data state to which the cell is being programmed (e.g., $V_T < $ PV2 for at least one of the cells being programmed to data state 00 and/or $V_T < $ PV3 for at least one of the cells being programmed to data state 10), then the process returns to step 418, and the programming voltage is shot again. In some embodiments, the programming voltage is shot for all of the cells of the set of uninhibited cells. In other embodiments, the programming voltage is only shot for cells with threshold voltages below the verify voltage corresponding to the data state to which the cell is being programmed.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for reducing bit line interference when programming a non-volatile memory device, the method comprising:

providing the non-volatile memory device comprising a set of cells, each cell of the set of cells associated with a bit line;

shooting a first shot of programming voltage across each cell of the set of cells;

detecting a threshold voltage for each cell;

identifying a fast subset of the set of cells and a slow subset of the set of cells based on at least the threshold voltage for each cell; and shooting one or more subsequent shots of the programming voltage until the threshold voltage for each cell of the set of cells is greater than a verify voltage, wherein for each shot of the one or more subsequent shots, a fast bit line bias is applied to the bit line associated with each cell of the fast subset and a slow bit line bias is applied to the bit line associated with each cell of the slow subset.

2. The method of claim 1 wherein the non-volatile memory is a flash memory.

3. The method of claim 1 wherein the fast bit line bias is greater than the slow bit line bias.

4. The method of claim 1 further comprising saving information identifying cells associated with at least one of the fast subset or the slow subset to cache.

5. The method of claim 1 wherein a bit line bias of 0.5V is applied to each of the bit lines associated with a cell of the fast subset.

6. The method of claim 1 wherein a bit line bias of 0V is applied to each of the bit lines associated with a cell of the slow subset.

7. The method of claim 1 further comprising dumping the program voltage for each bit of the set of bits before or during the shooting of the first shot of the programming voltage.

8. The method of claim 1 further comprising identifying a middle subset of the set of cells based at least in part on the threshold voltage associated with each cell of the set of cells, wherein the threshold voltage associated with a fast cell-is greater than the threshold voltage associated with a middle cell and the threshold voltage associated with the middle cell is greater than the threshold voltage associated with a slow cell, wherein the fast cell is one of the cells of the fast subset, the middle cell is one of the cells of the middle subset, and the slow cell is one of the cells of the slow subset; and
wherein for each of the first shot and the one or more subsequent shots, a fast bit line bias is applied to each bit line associated with a cell of the fast subset, a middle bit line bias is applied to each bit line associated with a cell of the middle subset, and a slow bit line bias is applied to each bit line associated with a cell of the slow subset.

9. The method of claim 8 wherein the fast bit line bias is greater than the middle bit line bias and the middle bit line bias is greater than the slow bit line bias.

10. The method of claim 1 further comprising based on at least the detected threshold voltage for each cell of the set of cells, determining a cutoff threshold voltage such that cells having a threshold voltage greater than the cutoff threshold voltage are associated with the fast subset and cells having a threshold voltage less than the cutoff threshold voltage are associated with the slow subset.

11. A non-volatile memory device with reduced bit line interference, the non-volatile memory device comprising:
a plurality of memory cells; and
a chip controller, the chip controller configured to program a set of cells of the plurality of memory cells by:
shooting a programming voltage across each programming cell, wherein a programming cell is a cell of the set of cells;
detecting a threshold voltage for each programming cell;
identifying a fast subset of the set of cells and a slow subset of the set of cells based on at least the detected threshold voltage for each programming cell; and
shooting one or more shots of the programming voltage until the threshold voltage for each programming cell of the set of cells is greater than a verify voltage, wherein for each of the one or more shots, a fast bit line bias is applied to the bit line associated with each cell of the fast subset and a slow bit line bias is applied to the bit line associated with each cell of the slow subset.

12. The non-volatile memory device of claim 11 wherein the fast bit line bias is greater than the slow bit line bias.

13. The non-volatile memory device of claim 11 wherein the non-volatile memory device is a flash memory device.

14. A method for reducing bit line interference when programming a non-volatile memory device comprising multi-level cells, the method comprising:
providing the non-volatile memory device comprising a set of multi-level cells, each cell of the set of multi-level cells associated with a bit line and each cell of the set of multi-level cells associated with a data state to which that cell is to be programmed;
identifying any cells of the set of multi-level cells having a threshold voltage greater than a verify voltage corresponding to a data state associated with that cell and creating a set of uninhibited cells by inhibiting a programming of cells identified as having a threshold voltage greater than the verify voltage corresponding to the data state associated with that cell;
shooting a first shot of programming voltage across each cell of the set of uninhibited cells;
detecting a threshold voltage for each cell of the set of uninhibited cells;
identifying a fast subset of the set of uninhibited cells and a slow subset of the set of uninhibited cells based on at least the detected threshold voltage for each cell, wherein the fast subset comprises one or more fast cells and the slow subset comprises one or more slow cells; and
shooting one or more subsequent shots of the programming voltage until the threshold voltage for each cell of the set of uninhibited cells is greater than a verify voltage corresponding to the data state associated with the cell, wherein for each of the one or more subsequent shots, a fast bit line bias is applied to each bit line associated with a fast cell and a slow bit line bias is applied to each bit line associated with a slow cell.

15. The method of claim 14 wherein a first verify voltage corresponds to a data state of 00 and a second verify voltage corresponds to a data state of 10.

16. The method of claim 14 wherein the fast bit line bias is greater than the slow bit line bias.

17. The method of claim 14 further comprising saving information identifying cells associated with at least one of the fast subset or the slow subset to cache.

18. The method of claim 14 wherein a bit line bias of 0.5V is applied to each bit line associated with a fast cell.

19. The method of claim 14 wherein a bit line bias of 0V is applied to each bit line associated with a slow cell.

20. The method of claim 14 further comprising dumping the program voltage for each cell of the set of uninhibited cells before or during the shooting of the first shot of the programming voltage.

* * * * *